(12) United States Patent
Yuasa

(10) Patent No.: US 9,029,697 B2
(45) Date of Patent: May 12, 2015

(54) ONBOARD DEVICE

(75) Inventor: Hiroaki Yuasa, Nisshin (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 26 days.

(21) Appl. No.: 14/114,792

(22) PCT Filed: May 18, 2011

(86) PCT No.: PCT/JP2011/061371
§ 371 (c)(1),
(2), (4) Date: Oct. 30, 2013

(87) PCT Pub. No.: WO2012/157084
PCT Pub. Date: Nov. 22, 2012

(65) Prior Publication Data
US 2014/0091085 A1  Apr. 3, 2014

(51) Int. Cl.
*H02G 3/08* (2006.01)
*B60R 16/023* (2006.01)
*H05K 5/00* (2006.01)

(52) U.S. Cl.
CPC .......... B60R 16/0239 (2013.01); H05K 5/0073 (2013.01)

(58) Field of Classification Search
CPC ......... H02G 3/08; H02G 3/081; H02G 3/086; H02G 3/14; H02G 3/16; B60R 16/0239; B60R 16/02; H05K 5/00; H05K 5/0026; H05K 5/02; H05K 5/0217; H05K 5/04; H05K 7/023; H05K 5/06
USPC ......... 174/50, 520, 559, 560, 561, 17 R, 539, 174/384; 220/3.2, 4.02, 4.26; 361/600, 601, 361/641, 679.01, 730, 796, 752; 439/76.1, 439/76.2, 535
See application file for complete search history.

(56) References Cited

U.S. PATENT DOCUMENTS

| | | | |
|---|---|---|---|
| 6,349,944 B1 | 2/2002 | Sugiyama et al. | |
| 6,560,115 B1* | 5/2003 | Wakabayashi et al. | ....... 361/752 |
| 6,629,619 B2* | 10/2003 | Sato et al. | .................... 220/4.02 |
| 7,589,278 B2* | 9/2009 | Bravo et al. | .................. 439/76.1 |
| 7,755,907 B2* | 7/2010 | Inagaki | ........................ 439/76.2 |
| 8,015,020 B2* | 9/2011 | Walding et al. | ................. 174/50 |
| 8,101,859 B2* | 1/2012 | Zadesky | .......................... 174/50 |
| 8,541,696 B2* | 9/2013 | Cochrane | ...................... 174/384 |
| 8,648,264 B2* | 2/2014 | Masumoto | ....................... 174/50 |
| 8,885,343 B2* | 11/2014 | Lischeck et al. | ................ 174/50 |
| 2002/0117812 A1 | 8/2002 | Mori et al. | |

FOREIGN PATENT DOCUMENTS

| | | |
|---|---|---|
| JP | H09-52534 A | 2/1997 |
| JP | 2000-240798 A | 9/2000 |
| JP | 2000-332452 A | 11/2000 |
| JP | 2002-257241 A | 9/2002 |
| JP | 2007-245940 A | 9/2007 |
| JP | 2008-220033 A | 9/2008 |
| JP | 2010-121662 A | 6/2010 |

* cited by examiner

Primary Examiner — Angel R Estrada
(74) Attorney, Agent, or Firm — Sughrue Mion, PLLC

(57) ABSTRACT

An overlapping region is located between an upper casing flange and a lower casing flange such that an outer end of lower casing flange is identical in alignment to an imaginary line passing through an outer end portion of the upper casing flange and being parallel to a side wall of an upper casing, or such that alignment of the outer end of the lower casing flange is at a side of the side wall of the upper casing.

5 Claims, 5 Drawing Sheets

ONBOARD DEVICE

CROSS REFERENCE TO RELATED APPLICATIONS

This application is a National Stage of International No. PCT/JP2001/061371, filed on May 18, 2011, the contents of all of which are incorporated herein by reference in their entirety.

TECHNICAL FIELD

The present invention relates to a structure of an onboard device.

BACKGROUND ART

An example of onboard devices mounted on a vehicle includes a power control unit. For example, a power control unit used in a hybrid vehicle (HV) includes equipment elements such as an electronic control unit (ECU), an inverter, a capacitor, and a voltage converter (DC/DC converter). These equipment elements are accommodated in respective housings, and the housings are stacked to constitute a single housing for the power control unit.

As to such an onboard device mounted on a vehicle, internal equipment elements need to be prevented from damage caused by entry of water into the device. Particularly, an adequate waterproofing measure needs to be taken against the entry of water into an interior portion of the device through a gap formed at an overlapping portion located on a casing of the onboard device.

PTD 1 (Japanese Patent Laying-Open No. 2007-245940) relates to a structure of an onboard electronic equipment element. According to the disclosed structure, either a casing or a cover has a sealing material retaining groove in an overlapping region located between the casing and the cover, and the groove is filled with a sealing material.

PTD 2 (Japanese Patent Laying-Open No. 2010-121662), PTD 3 (Japanese Patent Laying-Open No. 2002-257241), and PTD 4 (Japanese Patent Laying-Open No. 2000-240798) disclose tri-face sealing structures employed in an overlapping portion located between a cylinder block and a cylinder head.

CITATION LIST

Patent Document

PTD 1: Japanese Patent Laying-Open No. 2007-245940
PTD 2: Japanese Patent Laying-Open No. 2010-121662
PTD 3: Japanese Patent Laying-Open No. 2002-257241
PTD 4: Japanese Patent Laying-Open No. 2000-240798

SUMMARY OF INVENTION

Technical Problem

As to an onboard device, it is desired to employ a structure with a simple configuration capable of blocking entry of water through a gap formed at an overlapping portion located between members.

An object of the present invention is to solve the problem described above and to provide an onboard device including a structure with a simple configuration capable of blocking entry of water through a gap formed at an overlapping portion located between members.

Solution to Problem

An onboard device according to the present invention accommodates an equipment element in an interior portion defined by an upper casing and a lower casing. The upper casing includes at its lower end portion an upper casing flange extending outward. The lower casing includes at its upper end side a lower casing flange meeting with the upper casing flange. An overlapping region is located between the upper casing flange and the lower casing flange such that an outer end of the lower casing flange is identical in alignment to an imaginary line passing through an outer end of the upper casing flange and being parallel to a side wall of the upper casing, or such that alignment of the outer end of the lower casing flange is at a side of the side wall of the upper casing relative to the imaginary line.

In another embodiment, a sealing member is provided in the overlapping region located between the upper casing flange and the lower casing flange.

In another embodiment, the lower casing flange has at its outer end a bent flange bent downward, and the sealing member is provided so as to fill a gap formed between a lower face of the upper casing flange and a bent portion, the bent portion formed between the lower casing flange and the bent flange.

In another embodiment, the outer end of the upper casing flange has at its lower side a chamfered region.

In another embodiment, the onboard device is a power control unit mounted on a vehicle. The power control unit is mounted on the vehicle in a forward-tilted posture higher on a rear side of the vehicle than a front side. The overlapping region is located at least on the rear side of the vehicle.

In another embodiment, the upper casing is a body casing accommodating an electronic control unit, an inverter, a capacitor, and a voltage converter as electronic equipment elements. The lower casing is an undercover covering the voltage converter from a lower side.

In another embodiment, the body casing is made of aluminum, and the undercover is made of iron.

Advantageous Effects of Invention

According to the onboard device based on the present invention, an onboard device can be provided including a structure with a simple configuration capable of blocking entry of water through a gap formed at an overlapping portion between members.

DESCRIPTION OF EMBODIMENTS

Figure 1:
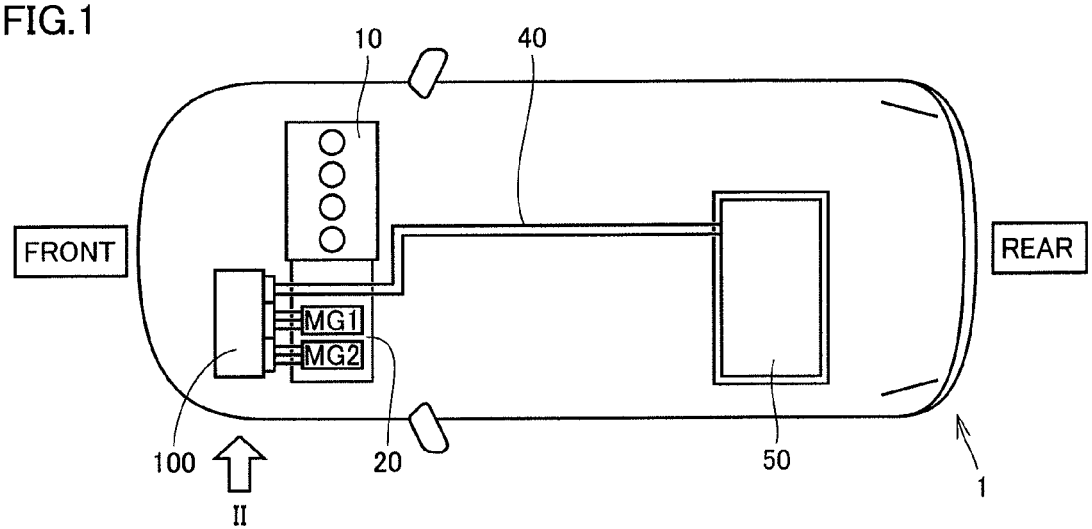
FIG. 1 is a schematic view representing a planar structure of a vehicle.

In the following, an onboard device in accordance with embodiments of the present invention will be described with reference to the drawings. The scope of the present invention is not limited to the number, quantity, and the like mentioned in the description of the embodiments, if any, unless otherwise specified. Further, the same or corresponding parts have the same reference numerals allotted, and an overlapping description will not be repeated. Further, using the configurations of the embodiments in suitable combination is initially assumed.

Figure 2:
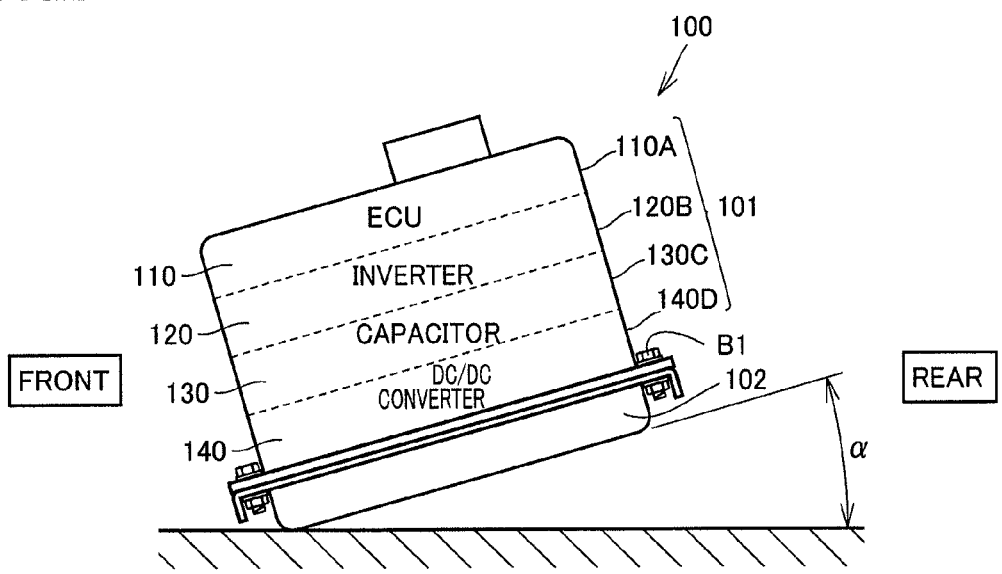
FIG. 2 represents the state where a power control unit is mounted on the vehicle, viewed from the arrow II in FIG. 1.

Firstly, referring to FIGS. 1 and 2, a power control unit 100 mounted on a hybrid vehicle (HV) will be described as an example of an onboard device. FIG. 1 is a schematic view representing a planar structure of the vehicle. FIG. 2 represents the state where power control unit 100 is mounted on the vehicle, viewed from the arrow II in FIG. 1.

Referring to FIG. 1, a hybrid vehicle (HV) 1 includes an engine 10 and a transaxle 20 arranged on the front side of vehicle 1. Transaxle 20 includes motor generators (MG1, MG2) and the like. Motor generators (MG1, MG2) and the like are connected to power control unit 100. Power control unit 100 is supplied with electric power through a power cable 40 from an HV battery 50 arranged on the rear side of vehicle 1.

Referring to FIG. 2, power control unit 100 includes an electronic control unit (ECU) 110, an inverter 120, a capacitor 130, and a voltage converter (hereinafter, referred to as "DC/DC converter") 140. These equipment elements are accommodated respectively in an ECU housing 110A, an inverter housing 120A, a capacitor housing 130A, and a DC/DC converter housing 140A. The housings are stacked to constitute a single housing as a body casing 101 for power control unit 100.

Under body casing 101, an undercover 102 is provided as a lower casing for closing a lower face side of DC/DC converter housing 140A. As will be described later about structural details, body casing 101 and undercover 102 are fastened together using a bolt B1 and the like.

In the present embodiment, body casing 101 is made of aluminum, and undercover 102 is made of iron. The materials of body casing 101 and undercover 102 are not limited to these materials.

When power control unit 100 is mounted on vehicle 1, power control unit 100 is mounted on vehicle 1 in a forward-tilted posture higher on a vehicle-rear side than on a vehicle-front side, as shown in FIG. 2. For example, the inclination angle ($\alpha$) of power control unit 100 with respect to the horizontal plane is approximately 18°.

Figure 3:
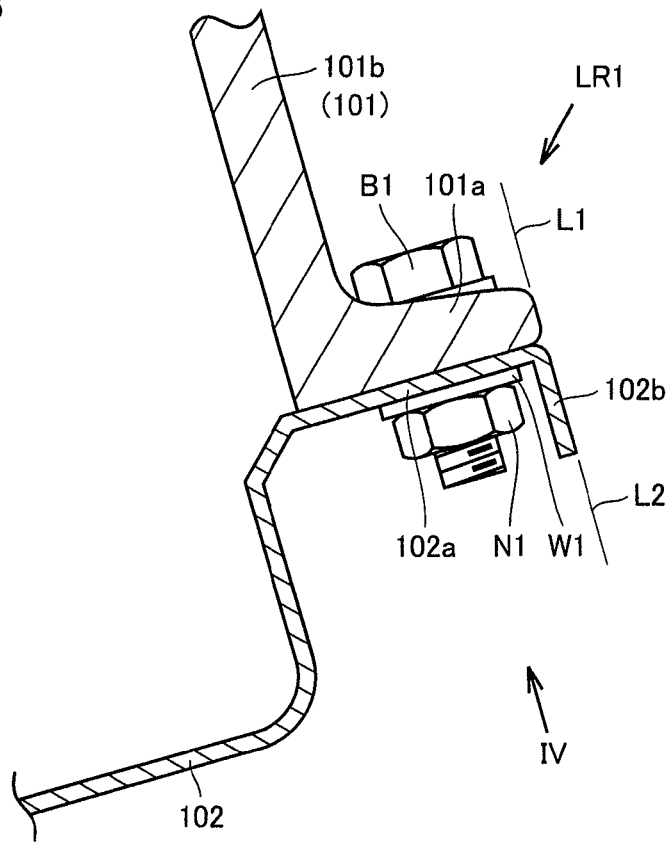
FIG. 3 is a cross-sectional view representing a partial enlargement of a structure in an overlapping region located between a body casing of the power control unit and an undercover in accordance with the present embodiment.
Figure 4:
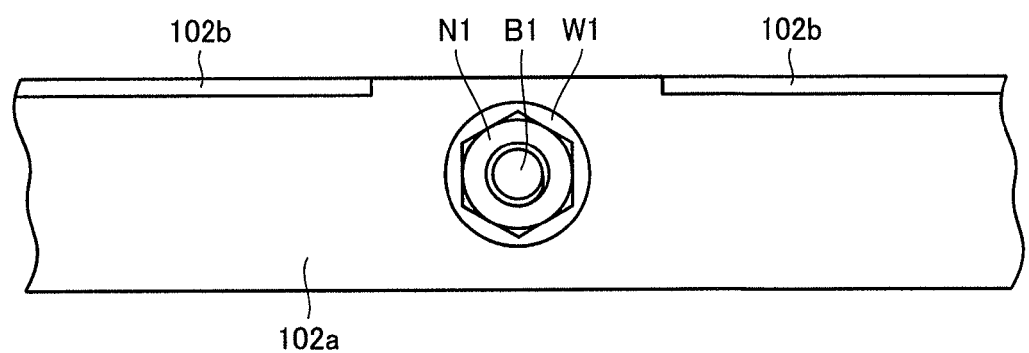
FIG. 4 is a view from the arrow IV in FIG. 3.

Next, referring to FIGS. 3 and 4, a structure for fastening body casing 101 and undercover 102 will be described. FIG. 3 is a cross-sectional view representing a partial enlargement of a structure in an overlapping region LR1 located between body casing 101 and undercover 102. FIG. 4 is a view from the arrow IV in FIG. 3.

Body casing 101 includes at a lower end portion of a side wall 101b an upper casing flange 101a extending outward. Undercover 102 includes at its upper end side a lower casing flange 102a overlapping with upper casing flange 101a. Further, lower casing flange 102a has at its outer end a bent flange 102b bent downward.

Further, for facilitating handling of bolt B1, a nut N1, and a washer W1 which will be described later, bent flange 102b is not provided in the periphery of a region to be fastened by bolt B1, nut N1, and washer W1 which will be described later (refer to FIG. 4). Further, when the overall rigidity of undercover 102 can be assured with a configuration having only lower casing flange 102a, bent flange 102b is dispensable.

Upper casing flange 101a and lower casing 102a are tightly fastened by means of bolt B1, nut N1, and washer W1.

Further, overlapping region LR1 between body casing 101 and undercover 102 is located between upper casing flange 101a and lower casing flange 102a such that alignment of an outer end L2 of lower casing flange 102a is identical in alignment to (on the same plane) an imaginary line (L1) passing through an outer end of upper casing flange 101a and being parallel to a side wall 101b of upper casing 101.

When power control unit 100 is mounted on vehicle 1, power control unit 100 is mounted on vehicle 1 in a forward-tilted posture higher on the rear side of vehicle 1 than the front side, as shown in FIG. 2. Therefore, in overlapping region LR1 located between body casing 101 and undercover 102 on the rear side of vehicle 1, water and the like are likely to remain on overlapping region LR1.

Figure 5:
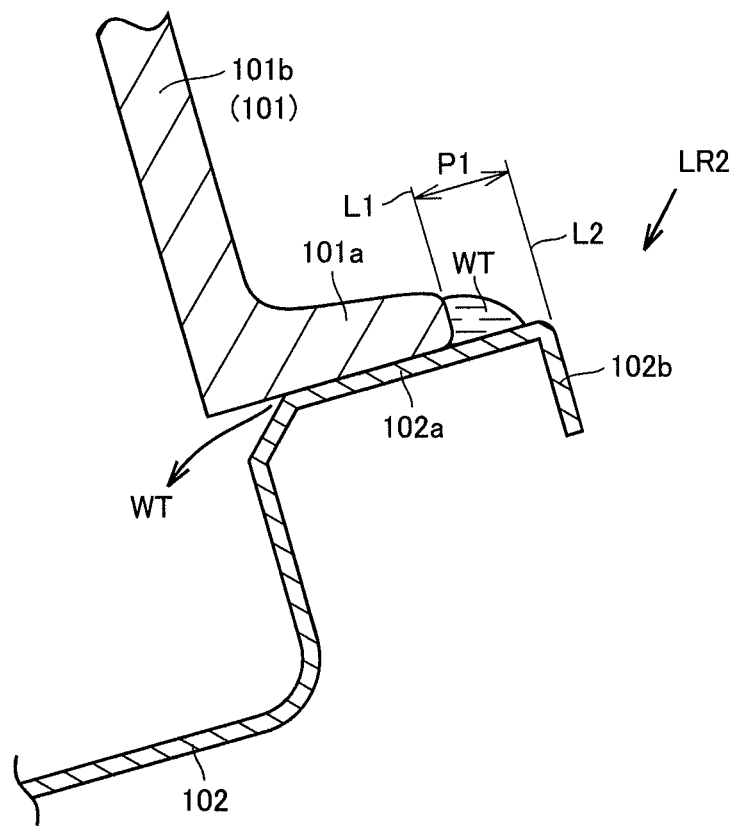
FIG. 5 is a cross-sectional view representing a partial enlargement of a structure in an overlapping region located between a body casing of a power control unit and an undercover in accordance with a comparative example.

FIG. 5 represents a cross-sectional structure of an overlapping region LR2 located between body casing 101 and undercover 102 in accordance with a comparative example. In the overlapping structure shown in the comparative example, outer end L2 of lower casing flange 102a is located so as to be on an outer side (in a direction apart from side wall 101b) from an imaginary line (L1) passing through an outer end of upper casing flange 101a and being parallel to side wall 101b of upper casing 101.

Therefore, outer end L2 of lower casing flange 102a projects from outer end L1 of upper casing flange 101a by a distance P1. In the case where such an overlapping configuration is employed, water WT will be accumulated at the portion of distance P1. If such a condition is left untreated, water is likely to enter gradually through a gap between upper casing flange 101a and lower casing flange 102a. Consequently, there is a possibility that water enters into the interior portion of power control unit 100.

For example, even when a sealing member (FIPG (Formed In Place Gaskets), liquid gasket) for water proofing is provided at the portion corresponding to distance P1, and particularly when water contains salt, corrosion caused by the salt may advance on upper casing flange 101a made of aluminum. Therefore, the gap between upper casing flange 101a and lower casing flange 102a will become larger, leading to higher possibility of water entry into the interior portion of power control unit 100.

On the other hand, in the structure of overlapping region LR1 between body casing 101 and undercover 102 in accordance with the present embodiment shown in FIG. 3, outer end L2 of lower casing flange 102a is provided so as to be identical in alignment to (on the same plane) the imaginary line (L1) passing through the outer end of upper casing 101a and being parallel to side wall 101b of upper casing 101. Therefore, water is not accumulated on lower casing flange 102a. Consequently, entry of water into the interior portion of power control unit 100 can be prevented.

The structure of overlapping region LR1 located between body casing 101 and undercover 102 shown in FIG. 3 may be provided entirely around the overlapping region located between body casing 101 and undercover 102. However, since water and the like are likely to be retained particularly in overlapping region LR1 located between body casing 101 and undercover 102 on the rear side of vehicle 1, the structure may preferably be provided at least on the vehicle-rear side.

As another embodiment of overlapping region LR1 located between body casing 101 and undercover 102, a liquid gasket (FIPG (Formed In Place Gaskets) and the like) may be preferably provided as a sealing member between upper casing flange 101a and lower casing flange 102a.

Figure 6:
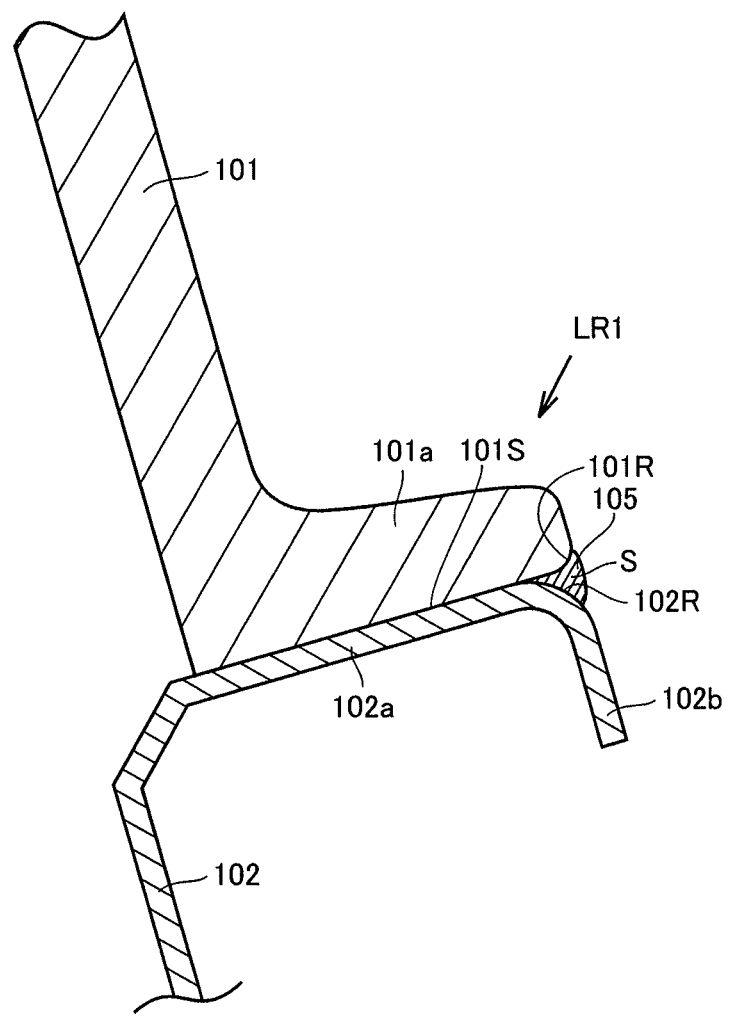
FIG. 6 is a cross-sectional view representing a partial enlargement of another structure in the overlapping region located between the body casing of the power control unit and the undercover in accordance with the present embodiment.

Specifically, as shown in FIG. 6, a sealing member 105 may be provided so as to fill gap S having a substantially triangular cross section formed between a lower face 101S of upper casing flange 101a and bent portion 102R provided between lower casing flange 102a and bent flange 102b.

Particularly, the region (gap S) to be filled with sealing member 105 can be formed clearly by providing a chamfered region 101R on a lower side of the outer end of upper casing flange 101a. Therefore, entry of water through the end of overlapping region LR1 located between body casing 101 and undercover 102 can be prevented.

Figure 7:
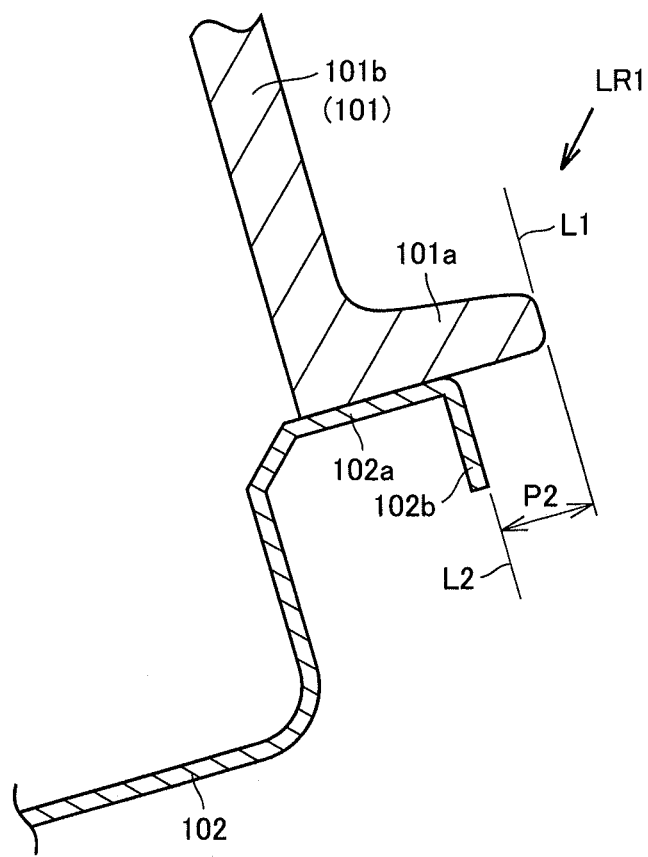
FIG. 7 is a cross-sectional view representing a partial enlargement of yet another structure in the overlapping region located between the body casing of the power control unit and the undercover in accordance with the present embodiment.

Further, the structure shown in FIG. 7 may be employed as yet another embodiment of overlapping region LR1 located between body casing 101 and undercover 102. According to this structure, an overlapping region (LR1) is located such that alignment of the outer end L2 of lower casing flange 102a is at side wall 101b of upper casing 101 relative to imaginary line L1 passing through the outer end of upper casing flange 101a and being parallel to side wall 101b of upper casing 101.

Therefore, the outer end position of upper casing flange 101a projects from outer end L2 of lower casing flange 102a by a distance P2. Consequently, water is not accumulated on lower casing flange 102a. As a result, entry of water into the interior portion of power control unit 100 can be prevented.

As described above, according to the structure of overlapping region LR1 located between body casing 101 and undercover 102 in accordance with the present embodiment, water is not accumulated on lower casing flange 102a. Therefore, entry of water through overlapping portion located between upper casing flange 101a and lower casing flange 102a can be prevented. Consequently, entry of water through a gap formed at the overlapping region of members can be prevented with a simple configuration.

In the description of the present embodiment, an example of the case was described where power control unit 100 is mounted on vehicle 1 in a forward-tilted posture higher on the vehicle-rear side than the vehicle-front side. However, the mounting posture of power control unit 100 is not limited to this, and another mounting posture may be employed.

Further, the case was described where the present invention is employed in a fastening region between body casing 101 of power control unit 100 and undercover 102. However, the configuration of the present embodiment can be employed in body casing 101 with respect to a structure for fastening ECU housing 110A and inverter housing 120A, a structure for fastening inverter housing 120A and capacitor housing 130A, and a structure for fastening capacitor housing 130A and DC/DC converter housing 140A.

Further, the case was described above where the present invention is employed in power control unit 100. As long as it is an onboard device accommodating an equipment element in the interior portion located by an upper casing and a lower casing, the present invention can be employed in a power storage device accommodating in its interior portion a power storage equipment element.

Further, the present invention can be applied to an overlapping region located between a cylinder block and cylinder head of an engine.

It should be understood that the embodiments disclosed herein are illustrative and non-restrictive in every respect. The scope of the present invention is defined by the terms of the claims, and is intended to include any modifications within the scope and meaning equivalent to the terms of the claims.

Reference Signs List 1 vehicle; 10 engine; 20 transaxle; 40 power cable; 50 battery; 100 power control unit; 101 body casing; 101R lower face; 101a upper casing flange; 101b side wall; 101R chamfered region; 102 undercover; 102R bent portion; 102a lower casing flange; 102b bent flange; 105 sealing member; 110A housing; 120 inverter; 120A inverter housing; 130 capacitor; 130A capacitor housing; and 140A converter housing.

The invention claimed is:

1. An onboard device accommodating an equipment element in an interior portion defined by an upper casing and a lower casing,
    said upper casing including at its lower end portion an upper casing flange extending outward, and
    said lower casing including at its upper end side a lower casing flange meeting with said upper casing flange, and
    an overlapping region is located between said upper casing flange and said lower casing flange such that alignment of an outer end of said lower casing flange is identical in alignment to an imaginary line passing through an outer end of said upper casing flange and being parallel to a side wall of said upper casing, or such that alignment of the outer end of said lower casing flange is at a side of said side wall of said upper casing relative to said imaginary line,
    wherein a sealing member is provided in said overlapping region located between said upper casing flange and said lower casing flange, and
    wherein said lower casing flange has at its outer end a bent flange bent downward, and
    said sealing member is provided so as to fill a gap formed between a lower face of said upper casing flange and a bent portion, the bent portion formed between said lower casing flange and said bent flange.

2. The onboard device according to claim 1, wherein the outer end of said upper casing flange has at its lower side a chamfered region.

3. The onboard device according to claim 1, wherein
    said onboard device is a power control unit mounted on vehicle, and
    said power control unit is mounted on said vehicle in a forward-tilted posture higher on a rear side of said vehicle than a front side, and
    said overlapping region is located at least on the rear side of said vehicle.

4. The onboard device according to claim 3, wherein
    said upper casing is a body casing accommodating an electronic control unit, an inverter, a capacitor, and a voltage converter as electronic equipment elements, and
    said lower casing is an undercover covering said voltage converter from a lower side.

5. The onboard device according to claim 4, wherein
    said body casing is made of aluminum, and
    said undercover is made of iron.

* * * * *